U.S. Patent No.: US 11,658,622 B2
Date of Patent: *May 23, 2023

(12) United States Patent
Tanaka et al.

(54) POWER AMPLIFIER CIRCUIT

(71) Applicant: Murata Manufacturing Co., Ltd., Kyoto (JP)

(72) Inventors: Satoshi Tanaka, Kyoto (JP); Kazuo Watanabe, Kyoto (JP); Yusuke Tanaka, Kyoto (JP); Satoshi Arayashiki, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 59 days.

This patent is subject to a terminal disclaimer.

(21) Appl. No.: 17/207,879

(22) Filed: Mar. 22, 2021

(65) Prior Publication Data

US 2021/0234519 A1 Jul. 29, 2021

Related U.S. Application Data

(63) Continuation of application No. 16/549,057, filed on Aug. 23, 2019, now Pat. No. 10,985,715.

(30) Foreign Application Priority Data

Sep. 4, 2018 (JP) .............................. JP2018-165368

(51) Int. Cl.
*H03F 1/22* (2006.01)
*H03F 3/217* (2006.01)
(Continued)

(52) U.S. Cl.
CPC ........... *H03F 3/217* (2013.01); *H03F 1/0205* (2013.01); *H03F 1/565* (2013.01); *H03F 3/2171* (2013.01);
(Continued)

(58) Field of Classification Search
CPC ........................................................ H03F 1/22
(Continued)

(56) References Cited

U.S. PATENT DOCUMENTS 8,354,889 B2 * 1/2013 Karthaus ............... H03F 1/0233
330/297
10,135,395 B2 11/2018 Tanaka et al.
(Continued)

FOREIGN PATENT DOCUMENTS

CN 106330109 A 1/2017
CN 108111135 A 6/2018
(Continued)

OTHER PUBLICATIONS

Tanaka, Satoshi, "Progress of the Linear RF Power Amplifier for Mobile Phones", IEICE Transactions on Fundamentals of Electronics, Communications and Computer Sciences, Tokyo, Japan, vol. E101-A, No. 2, Feb. 2018.
Korean Office action for 10-2019-0085489 dated Dec. 19, 2020.

*Primary Examiner* — Henry Choe
(74) *Attorney, Agent, or Firm* — Pearne & Gordon LLP

(57) ABSTRACT

A power amplifier circuit includes a lower transistor having a first terminal, a second terminal connected to ground, and a third terminal, wherein a first power supply voltage is supplied to the first terminal, and an input signal is supplied to the third terminal; a first capacitor; an upper transistor having a first terminal, a second terminal connected to the first terminal of the lower transistor via the first capacitor, and a third terminal, wherein a second power supply voltage is supplied to the first terminal, an amplified signal is outputted to an output terminal from the first terminal, and a driving voltage is supplied to the third terminal; a first inductor that connects the second terminal of the upper transistor to ground; a voltage regulator circuit; and at least (Continued)

one termination circuit that short-circuits an even-order harmonic or odd-order harmonic of the amplified signal to ground potential.

19 Claims, 13 Drawing Sheets

(51) Int. Cl.
*H03F 1/56* (2006.01)
*H03F 1/02* (2006.01)

(52) U.S. Cl.
CPC .. *H03F 2200/171* (2013.01); *H03F 2200/387* (2013.01); *H03F 2200/451* (2013.01)

(58) Field of Classification Search
USPC .................................................. 330/311, 310
See application file for complete search history.

(56) References Cited

U.S. PATENT DOCUMENTS

| | | |
|---|---|---|
| 2002/0089380 A1 | 7/2002 | Fujioka et al. |
| 2003/0022638 A1 | 1/2003 | Imai |
| 2007/0296505 A1 | 12/2007 | Oka |
| 2017/0272041 A1 | 9/2017 | Haruna |
| 2018/0152143 A1 | 5/2018 | Tanaka et al. |

FOREIGN PATENT DOCUMENTS

| | | |
|---|---|---|
| JP | H05-191176 A | 7/1993 |
| JP | H08-186455 A | 7/1996 |
| JP | 2003-046452 A | 2/2003 |
| JP | 2007-306299 A | 11/2007 |
| JP | 2013-211830 A | 10/2013 |
| JP | 2017-169168 A | 9/2017 |
| JP | 2018-085689 A | 5/2018 |
| KR | 10-2010-0024179 A | 3/2010 |
| WO | 2013/129431 A1 | 9/2013 |

* cited by examiner

POWER AMPLIFIER CIRCUIT

This application is a continuation of U.S. patent application Ser. No. 16/549,057 filed on Aug. 23, 2019, which claims priority from Japanese Patent Application No. 2018-165368 filed on Sep. 4, 2018. The contents of these applications are incorporated herein by reference in its entirety.

BACKGROUND OF THE DISCLOSURE

1. Field of the Disclosure

The present disclosure relates to a power amplifier circuit.

2. Description of the Related Art

In power amplifier circuits mounted in mobile communication devices such as mobile phones, there is a demand for increased the maximum output power of transmit signals to be transmitted to base stations. For example, Japanese Unexamined Patent Application Publication No. 2018-85689 discloses a power amplifier circuit in which two transistors are vertically connected to each other. In the disclosed power amplifier circuit, the upper and lower transistors are connected to each other via a capacitor, and the emitter of the upper transistor is grounded via an inductor, thereby rendering the upper and lower transistors conductive for alternating current and cut-off for direct current. Accordingly, a signal having a voltage amplitude that is about twice as high as the power supply voltage is outputted from the collector of the upper transistor, and the maximum output power is increased.

There is also a demand to reduce the power consumption of mobile communication devices carried by users. In particular, power amplifier circuits have relatively high power consumption, and therefore improvement in power-added efficiency (PAE) is important. For example, "Progress of the Linear RF Power Amplifier for Mobile Phones" by Satoshi TANAKA, IEICE Transactions on Fundamentals of Electronics, Communications and Computer Sciences, Vol. E101.A, No. 2, 2018, pp. 385-395 (hereinafter referred to as "Non-Patent Document") discloses a configuration in which harmonics of a transmit signal are controlled so that the even-order harmonics are short-circuited to ground potential and the odd-order harmonics are made open-circuited to allow a power amplifier to operate in a class-F mode. The class-F operation is known as a technology for providing both high linearity and high efficiency for power amplifiers.

However, the solution described in Non-Patent Document to improve power-added efficiency is not necessarily sufficient for the power amplifier circuit described in Japanese Unexamined Patent Application Publication No. 2018-85689.

BRIEF SUMMARY OF THE DISCLOSURE

Accordingly, it is an object of the present disclosure to provide a power amplifier circuit with improved power-added efficiency that can increase the maximum output power.

According to preferred embodiments of the present disclosure, a power amplifier circuit includes a lower transistor having a first terminal (collector), a second terminal (emitter), and a third terminal (base), wherein a first power supply voltage is supplied to the first terminal (collector), the second terminal (emitter) is connected to ground, and an input signal is supplied to the third terminal (base); a first capacitor; an upper transistor having a first terminal (collector), a second terminal (emitter), and a third terminal (base), wherein a second power supply voltage is supplied to the first terminal (collector), an amplified signal obtained by amplifying the input signal is output to an output terminal from the first terminal (collector), the second terminal (emitter) is connected to the first terminal (collector) of the lower transistor via the first capacitor, and a driving voltage is supplied to the third terminal (base); a first inductor that connects the second terminal (emitter) of the upper transistor to ground; a voltage regulator circuit; and at least one termination circuit that short-circuits one of an even-order harmonic or an odd-order harmonic of the amplified signal to ground potential. The at least one termination circuit is disposed so as to branch off from a node along a transmission path extending from the first terminal (collector) of the lower transistor to the output terminal through the first capacitor and the upper transistor.

According to preferred embodiments of the present disclosure, it may be possible to provide a power amplifier circuit with improved power-added efficiency that can increase the maximum output power.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes embodiments of the present disclosure in detail with reference to the drawings. The same or substantially the same elements are denoted by the same numerals, and will not be repeatedly described.

Figure 1:
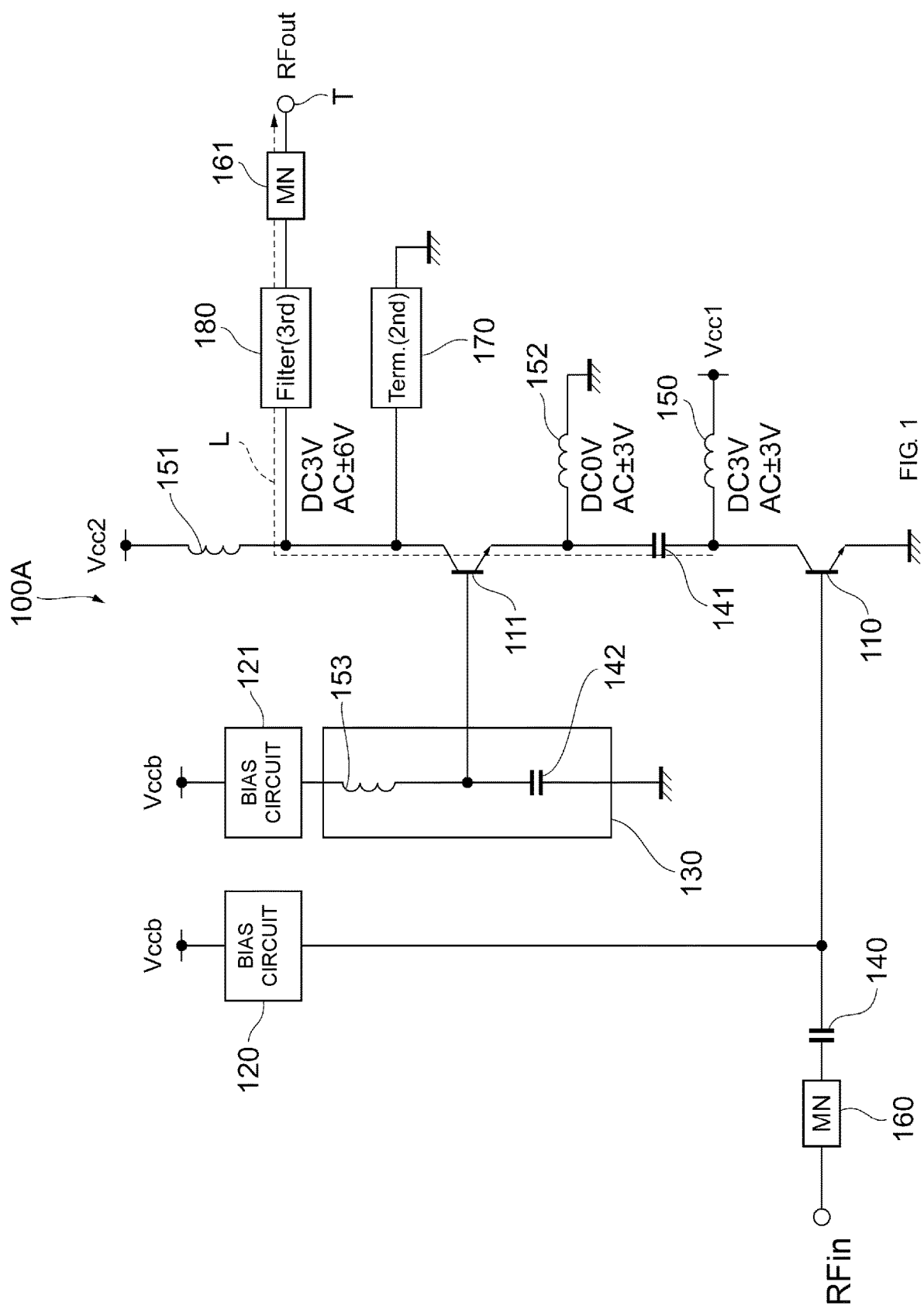
FIG. 1 illustrates an example configuration of a power amplifier circuit according to a first embodiment of the present disclosure.

FIG. 1 illustrates an example configuration of a power amplifier circuit 100A according to a first embodiment of the present disclosure. The power amplifier circuit 100A is mounted in, for example, a mobile communication device such as a mobile phone, and is configured to amplify an input radio frequency (RF) signal RFin and to output an amplified signal RFout. The RF signal RFin has a frequency of about several to several tens of gigahertz (GHz), for example.

As illustrated in FIG. 1, the power amplifier circuit 100A includes, for example, transistors 110 and 111, bias circuits 120 and 121, a voltage regulator circuit 130, capacitors 140 and 141, inductors 150 to 152, matching networks (MNs) 160 and 161, a termination circuit 170, and a filter circuit 180.

The transistors 110 and 111 are each constituted by a bipolar transistor such as a heterojunction bipolar transistor (HBT). The transistors 110 and 111 are not limited to bipolar transistors, and may be each constituted by a field-effect transistor such as a metal-oxide-semiconductor field-effect transistor (MOSFET). In this case, the terms "collector", "base", and "emitter" are changed to the terms "drain", "gate", and "source", respectively. In the following description, the two transistors 110 and 111 are sometimes referred to collectively as an "amplifier".

A power supply voltage Vcc1 (first power supply voltage) is supplied to a collector (first terminal) of the transistor 110 (lower transistor) via the inductor 150. The RF signal RFin (input signal) is supplied to a base (third terminal) of the transistor 110 via the matching network 160 and the capacitor 140. An emitter (second terminal) of the transistor 110 is grounded. The base of the transistor 110 is also supplied with a bias current or bias voltage outputted from the bias circuit 120. Accordingly, an amplified signal obtained by amplifying the RF signal RFin is outputted from the collector of the transistor 110.

A power supply voltage Vcc2 (second power supply voltage) is supplied to a collector (first terminal) of the transistor 111 (upper transistor) via the inductor 151. A bias current or bias voltage outputted from the bias circuit 121 is supplied to a base (third terminal) of the transistor 111 via the voltage regulator circuit 130. An emitter (second terminal) of the transistor 111 is grounded via the inductor 152. The emitter of the transistor 111 is connected to the collector of the transistor 110 via the capacitor 141. Accordingly, the amplified signal RFout, which is obtained by amplifying the RF signal RFin, is outputted to an output terminal T from the collector of the transistor 111.

The capacitor 141 (first capacitor) connects the emitter of the upper transistor 111 and the collector of the lower transistor 110. The capacitor 141 has a function of isolating the upper transistor 111 and the lower transistor 110 from each other for direct current and connecting the upper transistor 111 and the lower transistor 110 to each other for alternating current.

The inductor 152 (first inductor) has an end connected to the emitter of the transistor 111 and another end grounded. The inductor 152 has a function of connecting the emitter of the upper transistor 111 to ground for direct current.

The effect of the connection of the transistors 110 and 111, the capacitor 141, and the inductor 152 in the manner described above will be described, assuming that the power supply voltages Vcc1 and Vcc2 are each 3 V.

Since the power supply voltage Vcc1 (DC3V) is supplied to the collector of the lower transistor 110 for direct current, the collector voltage of the lower transistor 110 varies in a range of DC3V±AC3V. The emitter voltage of the upper transistor 111 varies in a range of DC0V±AC3V since the emitter of the upper transistor 111 is grounded for direct current and is connected to the collector of the lower transistor 110 for alternating current. The collector voltage of the transistor 111 varies in a range of DC3V±AC6V since the power supply voltage Vcc2 (DC3V) is supplied to the collector of the transistor 111 for direct current and the signal amplitudes at the collector and emitter of the transistor 111 are added together for alternating current. Accordingly, the signal amplitude across the collector and emitter of the upper transistor 111 is the same as the signal amplitude across the collector and emitter of the lower transistor 110, whereas the signal amplitude at the collector of the upper transistor 111 is about twice as high as the signal amplitude across the collector and emitter.

Given that the output power of a signal is denoted by P, the collector voltage by V, and the load impedance of the amplifier by R, then, a relation of $P=V^2/R$ holds. In this case, in order to double the voltage amplitude and double the output power, the load impedance is doubled. In the power amplifier circuit 100A, accordingly, the load impedance can be doubled without increasing the power supply voltage, and the maximum output power of a signal can be increased, compared to a configuration in which transistors are not vertically connected to each other.

The bias circuits 120 and 121 generate a bias current or bias voltage and supply the bias current or bias voltage to the bases of the transistors 110 and 111, respectively. The configuration of the bias circuits 120 and 121 is not limited to any specific one, and will not be described in detail.

The voltage regulator circuit 130 is disposed between the bias circuit 121 and the base of the upper transistor 111. In this embodiment, the voltage regulator circuit 130 includes an inductor 153 and a capacitor 142, which are connected in series. A bias current is supplied to an end of the inductor 153 from the bias circuit 121. The other end of the inductor 153 is connected to the base of the upper transistor 111. The capacitor 142 has an end connected to the base of the upper transistor 111 and another end grounded.

The voltage regulator circuit 130 adjusts the impedance seen from the base terminal of the transistor 111 so that operations based on the amplitude of the voltage (driving voltage) to be supplied to the base of the transistor 111 are not restricted by the bias circuit 121. That is, in order to turn on the upper transistor 111, the base-emitter voltage of the transistor 111 needs to be greater than or equal to a predetermined voltage. Accordingly, the base voltage of the transistor 111 needs to vary with the emitter voltage of the transistor 111. The voltage regulator circuit 130 including the capacitor 142 functions to make the base voltage of the transistor 111 vary for alternating current. The capacitance value of the capacitor 142 is preferably smaller than the capacitance value of the capacitor 141. This is because an excessively large capacitance value of the capacitor 142 suppresses the variation of the base voltage of the transistor 111.

The capacitor 140 removes the direct current component of an RF signal. Each of the inductors 150 and 151 suppresses coupling of an RF signal to a power supply circuit (not illustrated).

The matching networks 160 and 161 each match the impedances of the preceding and subsequent circuits. Each of the matching networks 160 and 161 is constituted by an inductor and/or a capacitor, for example.

The termination circuit 170 is disposed so as to branch off from a node along a transmission path L (see the broken line in FIG. 1) extending from the collector of the lower transistor 110 to the output terminal T through the capacitor 141 and the upper transistor 111, the node being positioned between the collector of the transistor 111 and the matching network 161. In this embodiment, the termination circuit 170 is constituted by, for example, a notch filter circuit that short-circuits the second-order harmonic of the amplified signal RFout to ground potential (i.e., terminates the harmonic with low impedance).

Figure 2A:
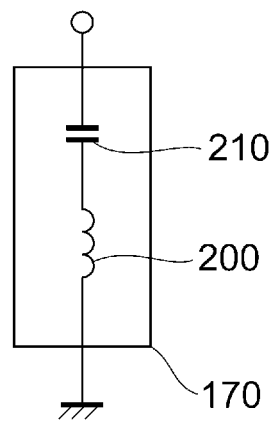
FIG. 2A illustrates a specific example of a termination circuit.
Figure 2B:
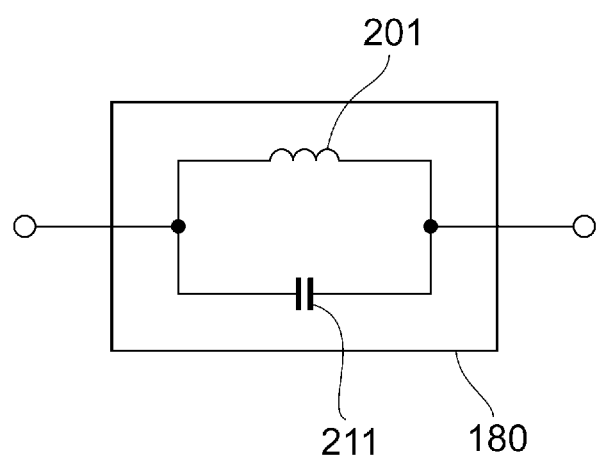
FIG. 2B illustrates a specific example of a filter circuit.
Figure 3A:
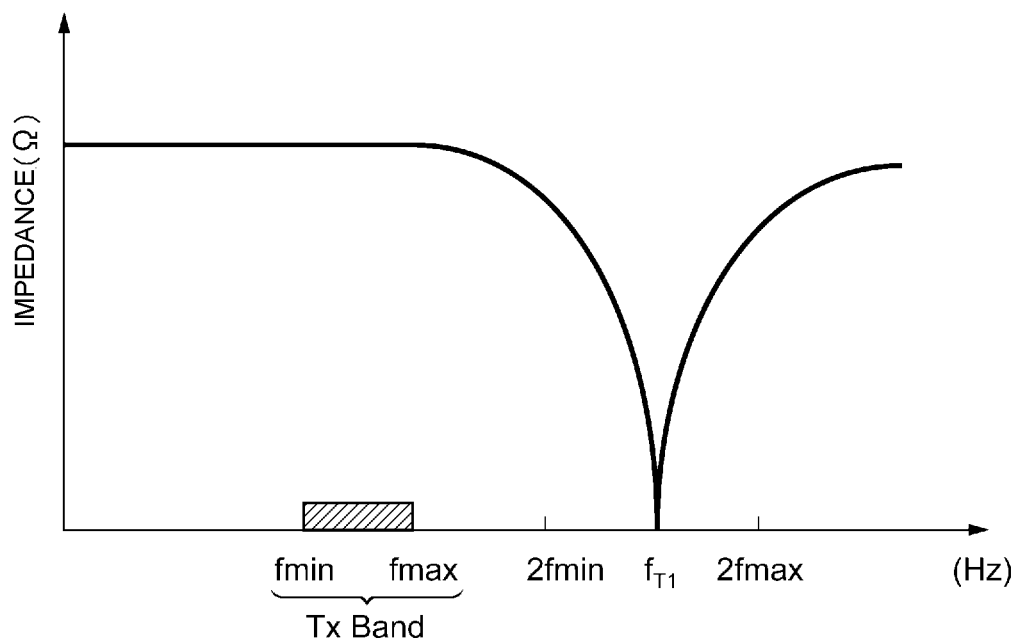
FIG. 3A is a graph illustrating the frequency characteristic of the impedance of the termination circuit.

FIG. 2A illustrates a specific example of the termination circuit 170. In FIG. 2A and FIG. 2B described below, a termination circuit and a filter circuit are each constituted by a lumped constant circuit, by way of example. However, a termination circuit and a filter circuit may be each constituted by a transmission line instead of a lumped constant circuit. FIG. 3A is a graph illustrating the frequency characteristic of the impedance of the termination circuit 170. In the graph illustrated in FIG. 3A, the vertical axis represents impedance (Ω) and the horizontal axis represents frequency (Hz).

As illustrated in FIG. 2A, the termination circuit 170 is constituted by, for example, an LC series resonant circuit including an inductor 200 and a capacitor 210, which are connected in series. The LC series resonant circuit has a characteristic in which impedance is locally low at a resonant frequency $f_0=1/(2\pi\sqrt{LC})$ (Hz), where L denotes the inductance value of the inductor and C denotes the capacitance value of the capacitor. Accordingly, if the transmit frequency band ranges from fmin to fmax (Hz), as illustrated in FIG. 3A, the constants of the inductor 200 and the capacitor 210 are set so that the resonant frequency $f_{T1}$ of the termination circuit 170 is included in the second-order harmonic band of 2fmin to 2fmax (Hz) of a transmit signal. Thus, the second-order harmonic can be selectively short-circuited to ground potential. Furthermore, the Q value of the termination circuit 170 is preferably set so that the impedance is sufficiently high and the signal loss can be reduced within the transmit frequency band. The resonant frequency $f_{T1}$ may be set to a frequency that is twice as high as the center frequency of the transmit frequency band, for example, or may be shifted to a higher or lower frequency than the frequency that is twice as high as the center frequency, taking into account impedance variations or signal loss within the transmit frequency band.

The filter circuit 180 is connected in series with the transmission path L between the collector of the upper transistor 111 and the matching network 161 along the transmission path L. In this embodiment, the filter circuit 180 is constituted by, for example, a tank circuit (LC parallel resonant circuit) that makes the third-order harmonic of the amplified signal open-circuited.

Figure 3B:
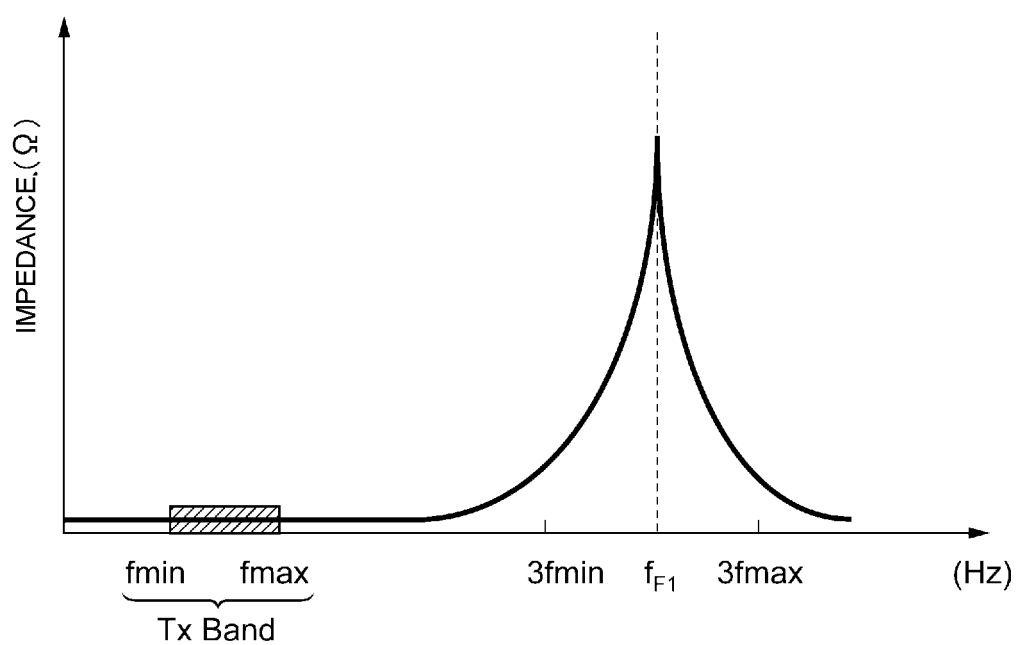
FIG. 3B is a graph illustrating the frequency characteristic of the impedance of the filter circuit.

FIG. 2B illustrates a specific example of the filter circuit 180, and FIG. 3B is a graph illustrating the frequency characteristic of the impedance of the filter circuit 180. In the graph illustrated in FIG. 3B, the vertical axis represents impedance (Ω) and the horizontal axis represents frequency (Hz).

As illustrated in FIG. 2B, the filter circuit 180 is constituted by, for example, an LC parallel resonant circuit including an inductor 201 and a capacitor 211, which are connected in parallel. The LC parallel resonant circuit has a characteristic in which impedance is locally high at a resonant frequency $f_0=1/(2\pi\sqrt{LC})$ (Hz), where L denotes the inductance value of the inductor and C denotes the capacitance value of the capacitor. Accordingly, as illustrated in FIG. 3B, the constants of the inductor 201 and the capacitor 211 are set so that the resonant frequency $f_{F1}$ of the filter circuit 180 is included in the third-order harmonic band of 3fmin to 3fmax (Hz) of a transmit signal. Thus, the third-order harmonic can be selectively made open-circuited. Furthermore, the Q value of the filter circuit 180 is preferably set so that the impedance is sufficiently low and the signal loss can be reduced within the transmit frequency band. The resonant frequency $f_{F1}$ may be set to a frequency that is three times as high as the center frequency of the transmit frequency band, for example, or may be shifted to a higher or lower frequency than the frequency that is three times as high as the center frequency, taking into account impedance variations or signal loss within the transmit frequency band.

The elements included in the termination circuit 170 and the filter circuit 180 may be disposed on a semiconductor substrate having the transistors 110 and 111 and so on. Alternatively, for example, the capacitors 210 and 211 may be disposed on the semiconductor substrate, and the inductors 200 and 201 may be disposed on a module substrate on which the semiconductor substrate is mounted. In FIG. 1, in terms of the functional configuration, the filter circuit 180 and the matching network 161 are separately illustrated. However, the filter circuit 180 and the matching network 161 may not necessarily be separately formed, and, for example, the matching network 161 may have the function of the filter circuit 180.

As described above, among harmonics outputted from the amplifier, the second-order harmonic, which is part of the even-order harmonics, is short-circuited and the third-order harmonic, which is part of the odd-order harmonics, is made open-circuited, thereby making the waveform of the collector current of the transistors 110 and 111 close to a half-wave rectified waveform and making the waveform of the collector voltage of the transistors 110 and 111 close to a rectangular waveform. Thus, the amplifier operates in a so-called class-F mode.

Figure 4:
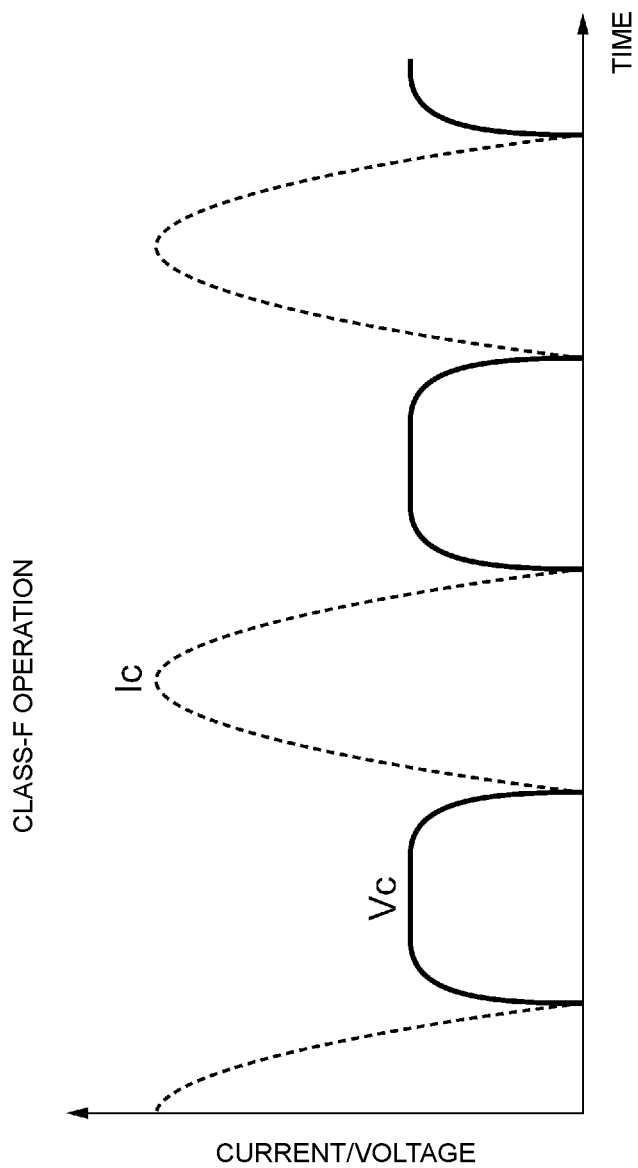
FIG. 4 illustrates waveforms of the collector voltage and collector current of an amplifier when operating in a class-F mode.

FIG. 4 illustrates the waveforms of a collector voltage Vc (solid line) and a collector current Ic (dotted line) of the amplifier when operating in a class-F mode. As illustrated in FIG. 4, in the class-F operation, phase adjustment is performed so that the peaks of the voltage waveform do not overlap the peaks of the current waveform. This adjustment reduces the time period in which the waveform of the collector current Ic and the waveform of the collector voltage Vc overlap. As a result, the power consumption (=collector current Ic×collector voltage Vc) of the amplifier ideally becomes 0 W. In the class-F operation, therefore, the power-added efficiency of the power amplifier circuit 100A is improved.

The harmonics to be controlled to be short-circuited or made open-circuited are not limited to the second-order harmonic and the third-order harmonic. Any of the second and higher even-order harmonics may be short-circuited, and any of the third and higher odd-order harmonics may be made open-circuited.

In this embodiment, a common current flows through the lower transistor 110 and the upper transistor 111. That is, the capacitance value of the capacitor 141 and the inductance values of the inductors 150 and 152 are sufficiently large, and their impedances are assumed to be negligible. In this case, the collector current flowing through the lower transistor 110 is equal to the collector current flowing through the upper transistor 111. Further, the collector voltage waveform of the lower transistor 110 has an amplitude that is about half the collector voltage waveform of the upper transistor 111, and the emitter voltage waveform of the upper transistor 111 is equal to the collector voltage waveform of the lower transistor 110. Accordingly, the collector-emitter voltage waveform of the upper transistor 111 is equal to the collector-emitter voltage waveform of the lower transistor 110. In this embodiment, therefore, the harmonics of the output of the upper transistor 111 are controlled, thereby allowing harmonics caused by the lower transistor 110 to be also controlled at the same time.

As described above, the power amplifier circuit 100A can output the amplified signal RFout having a voltage amplitude that is about twice as high as that in a configuration in which transistors are not vertically connected to each other, and thus the maximum output power can be increased. In addition, since the power amplifier circuit 100A includes the termination circuit 170 that short-circuits the second-order harmonic to ground potential, and the filter circuit 180 that makes the third-order harmonic open-circuited, the amplifier can operate in a class-F mode. Thus, the power-added efficiency of the power amplifier circuit 100A can be improved and the direct current power consumption can be reduced without controlling the harmonics of the output of the lower transistor 110.

Furthermore, in the power amplifier circuit 100A including both the termination circuit 170 and the filter circuit 180, the voltage and current waveforms of the amplifier are shaped, compared to a configuration including one of the termination circuit 170 and the filter circuit 180. Thus, the power-added efficiency is further improved. The power amplifier circuit 100A may not necessarily include one of the termination circuit 170 and the filter circuit 180.

In the power amplifier circuit 100A described above, the termination circuit 170 is connected to the collector of the upper transistor 111. However, a termination circuit may be connected to the collector of the lower transistor 110 instead of the upper transistor 111.

In FIG. 1, furthermore, the power amplifier circuit 100A includes one stage of amplifier. However, the power amplifier circuit 100A may include two or more stages of amplifiers including, for example, an initial stage (drive stage) and a subsequent stage (power stage). In a power amplifier circuit including two or more stages of amplifiers, preferably, the configuration illustrated in FIG. 1 is applied to, for example, the amplifier in the final stage, where the output power of a signal is the highest, and the other amplifier or amplifiers have a configuration in which transistors are not vertically connected to each other. This configuration suppresses an increase in circuit size, compared to the case where the configuration illustrated in FIG. 1 is applied to all amplifiers. It should be noted that the configuration illustrated in FIG. 1 may be applied to an amplifier other than the amplifier in the final stage, such as an amplifier for which high gain is required.

The number of transistors vertically connected to each other is not limited to two and may be three or more. For example, when N transistors (N is an integer of 2 or more) are vertically connected to each other, the signal amplitude at the collector of the uppermost transistor is about N times as high as the signal amplitude at the collector of one transistor.

Figure 5:
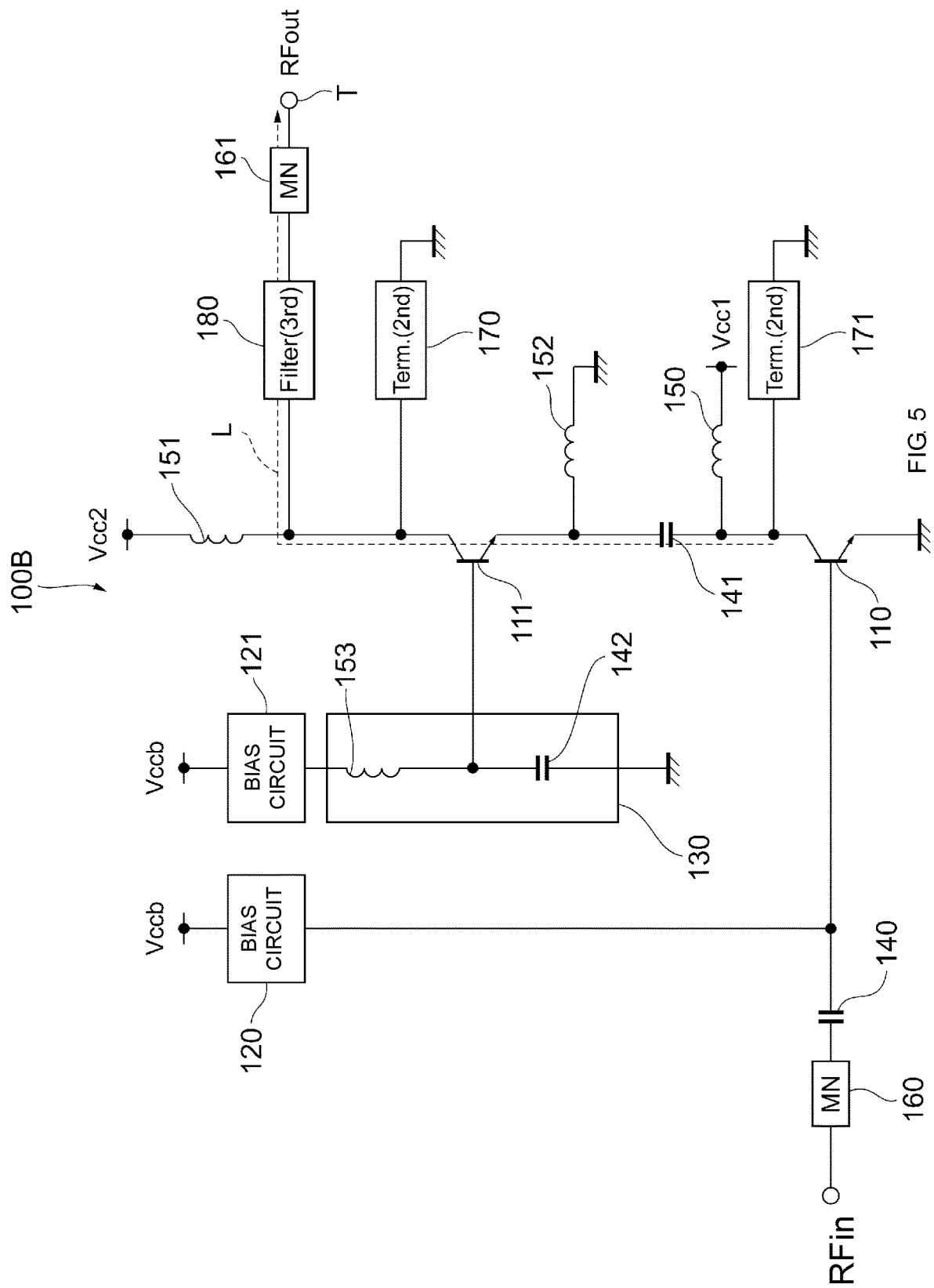
FIG. 5 illustrates an example configuration of a power amplifier circuit according to a second embodiment of the present disclosure.

FIG. 5 illustrates an example configuration of a power amplifier circuit 100B according to a second embodiment of the present disclosure. In the following embodiments, the same or substantially the same elements as those of the power amplifier circuit 100A are denoted by the same numerals, and will not be repeatedly described. Further, features common to the first embodiment will not be described, and only the differences will be described. In particular, similar operational effects achieved with similar configurations will not be described again in the individual embodiments.

In the power amplifier circuit 100B, as illustrated in FIG. 5, a termination circuit 171 is connected also to the output of the lower transistor 110, in addition to the upper transistor 111. The termination circuit 171 (first termination circuit) is disposed so as to branch off from a node between the collector of the lower transistor 110 and the emitter of the upper transistor 111 along the transmission path L. In this embodiment, the termination circuit 171 has the same resonant frequency as the termination circuit 170 (second termination circuit) and is configured to short-circuit the second-order harmonic of the amplified signal RFout to ground potential. The specific configuration of the termination circuit 171 can be similar to that of the termination circuit 170 illustrated in, for example, FIG. 2A, and will not be described in detail.

The lower and upper transistors 110 and 111 perform basically the same operation. The symmetry of the lower and upper transistors 110 and 111 may fail depending on the settings of the voltage regulator circuit 130 or when the impedance of the inductor 150 or 152 or the capacitor 141 is not sufficiently high. Even in this case, in the power amplifier circuit 100B, each of the lower and upper transistors 110 and 111 is connected to a termination circuit, and, thus, the voltage and current waveforms of the collectors of the transistors 110 and 111 can be appropriately shaped. In addition, the termination circuit 171 also short-circuits the second-order harmonic that appears at the emitter of the upper transistor 111 to ground potential. Accordingly, the shaping of the voltage and current waveforms of the transistor 111 is supported.

In FIG. 5, an end of the termination circuit 171 is connected between the collector of the transistor 110 and the capacitor 141. However, the connection position of the end of the termination circuit 171 is not limited to this, and the end of the termination circuit 171 may be connected to any node between the collector of the transistor 110 and the emitter of the transistor 111.

Figure 6:
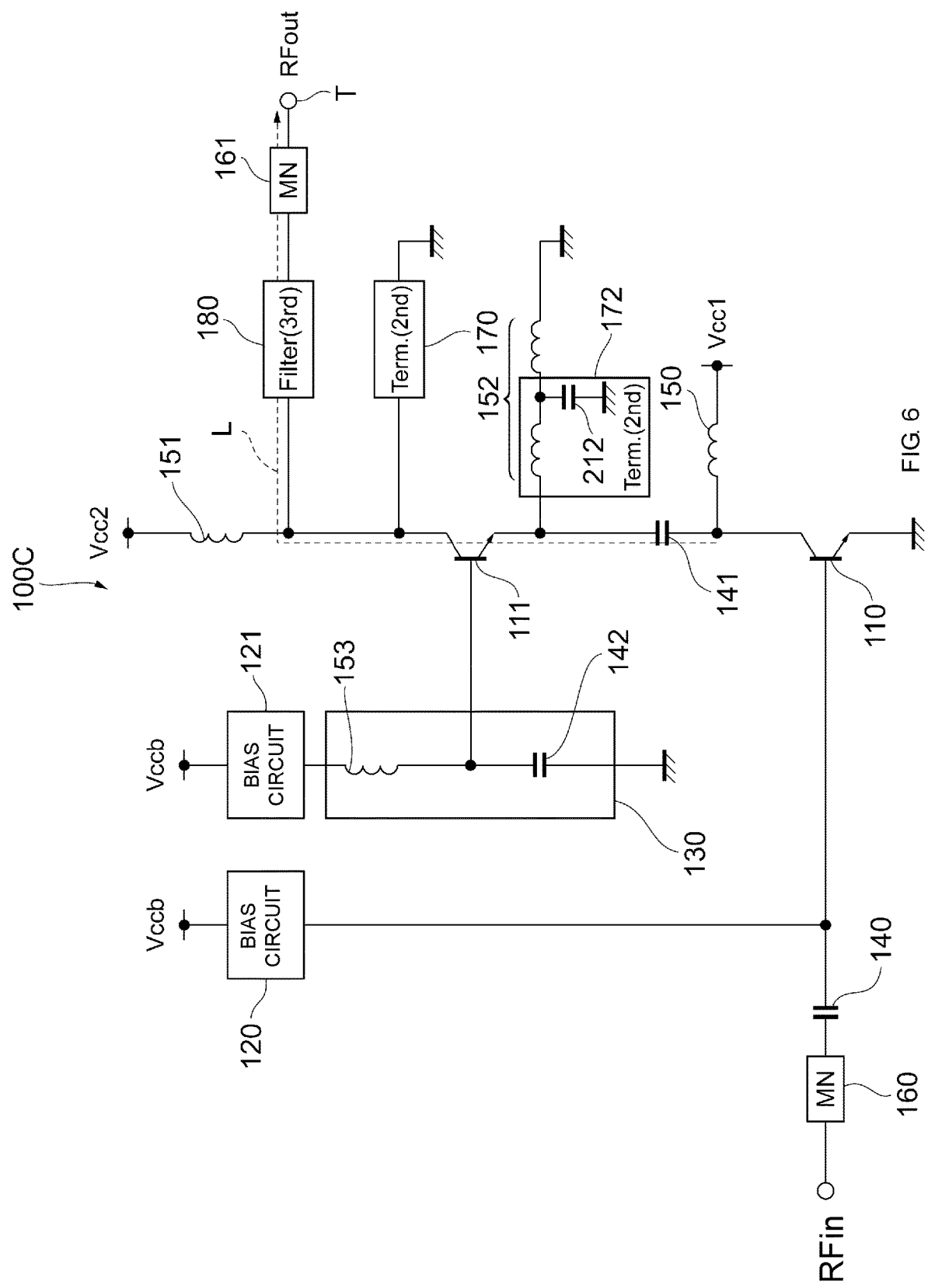
FIG. 6 illustrates an example configuration of a power amplifier circuit according to a third embodiment of the present disclosure.

FIG. 6 illustrates an example configuration of a power amplifier circuit 100C according to a third embodiment of the present disclosure. As illustrated in FIG. 6, unlike the power amplifier circuit 100B, the power amplifier circuit 100C includes a termination circuit 172 instead of the termination circuit 171.

The termination circuit 172 includes part of the inductor 152, which connects the emitter of the upper transistor 111 to ground, as an inductor included in an LC series resonant circuit. Specifically, the termination circuit 172 includes part of the inductor 152, and a capacitor 212 (second capacitor) that branches off from a point on a coil conductor included in the inductor 152 and that is connected to ground. If the inductance value of one of the two divided portions of the inductor 152 connected to ground has sufficiently high impedance for the fundamental, the impedance appears to be an open circuit for the fundamental. In the termination circuit 172, thus, part of the inductor 152 and the capacitor 212 function as an LC series resonant circuit. The inductance value used to determine the resonant frequency of the LC series resonant circuit corresponds to the inductance value determined when the two divided portions of the inductor 152 are connected in parallel. The function of the termination circuit 172 is similar to that of the termination circuit 171, and will not be described in detail.

With the configuration described above, in the power amplifier circuit 100C, the termination circuit 172 is constituted by fewer elements than in the power amplifier circuit 100B and can achieve advantages similar to those of the power amplifier circuit 100B.

In FIG. 6, part of the inductor 152 functions as an inductance component of the termination circuit 172, by way of example. Alternatively, for example, part of the inductor 150 may function as an inductance component of a termination circuit. In this case, a capacitor corresponding to the capacitor 212 may branch off from a point on a coil conductor included in the inductor 150 and may be connected to ground.

In the power amplifier circuits 100B and 100C described above, two termination circuits have an equal resonant frequency. However, these termination circuits may have different resonant frequencies. A fourth embodiment (a power amplifier circuit 100D) provides, for example, a configuration similar to that of the power amplifier circuit 100B illustrated in FIG. 5, in which the two termination circuits 170 and 171 respectively have resonant frequencies $f_{T1}$ and $f_{T2}$ that are different.

Figure 7:
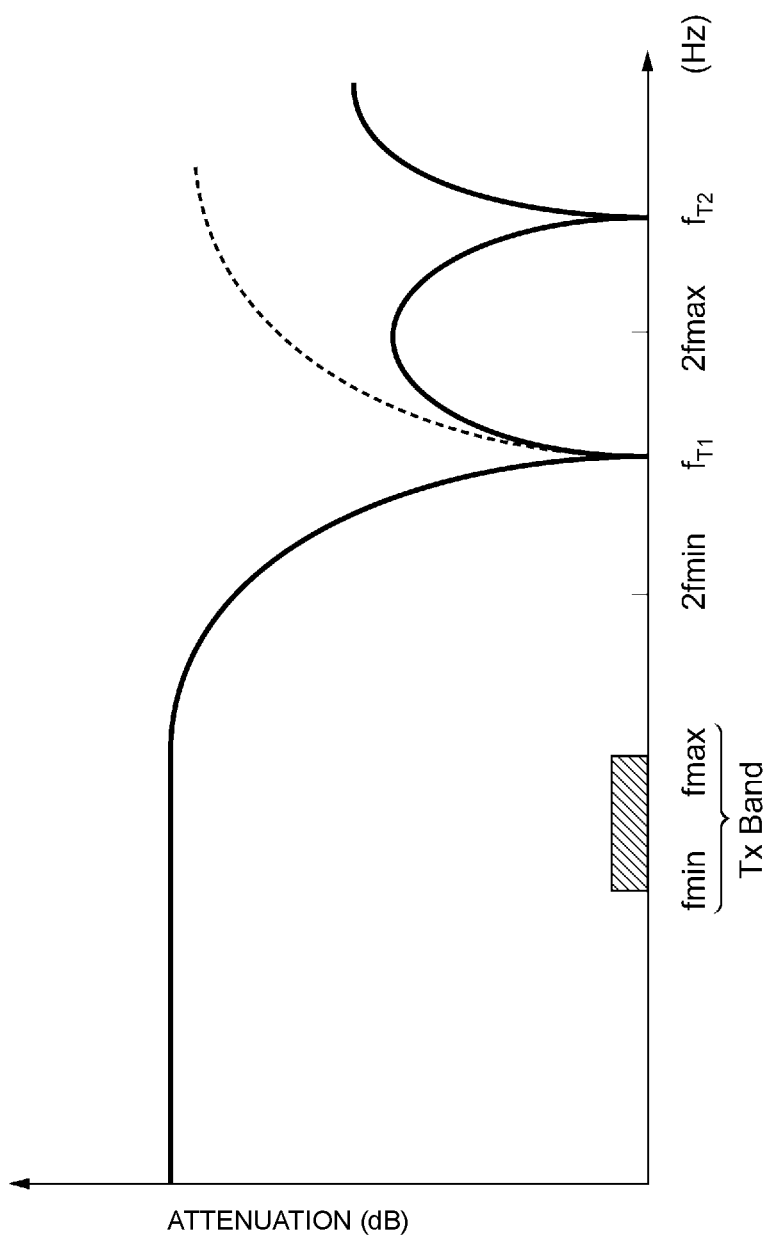
FIG. 7 is a graph illustrating the frequency characteristic of the attenuation of an output signal in a power amplifier circuit according to a fourth embodiment of the present disclosure.

FIG. 7 is a graph illustrating the frequency characteristic of the attenuation of an output signal in the power amplifier circuit 100D. In this embodiment, the resonant frequencies $f_{T1}$ and $f_{T2}$ of the termination circuits 170 and 171 are different. Thus, in FIG. 7, the vertical axis represents attenuation (dB) instead of impedance.

As illustrated in FIG. 7, in this embodiment, the resonant frequency $f_{T1}$ of the termination circuit 170 is set to a frequency that is about twice as high as the center frequency of the transmit frequency band, and the resonant frequency $f_{T2}$ of the termination circuit 171 is set to a frequency higher than the upper limit 2fmax (Hz) of the second-order harmonic band. This setting allows the second-order harmonic to be attenuated over a wider range than that for a configuration including a single termination circuit (see the broken line). Accordingly, the second-order harmonic is sufficiently short-circuited to ground potential over a wider frequency range than that in a configuration including a single termination circuit. Thus, the power-added efficiency is expected to be further improved. This embodiment is suitable for, for example, a comparatively wide transmit frequency band.

The method for shifting the resonant frequencies of the two termination circuits is not limited to that described above. As described above, one of the resonant frequencies may be shifted to a higher frequency than the center frequency of the second-order harmonic, thereby suppressing the attenuation of the fundamental frequency component to be transmitted, compared to the case where the one of the resonant frequencies may be shifted to a lower frequency.

Figure 8:
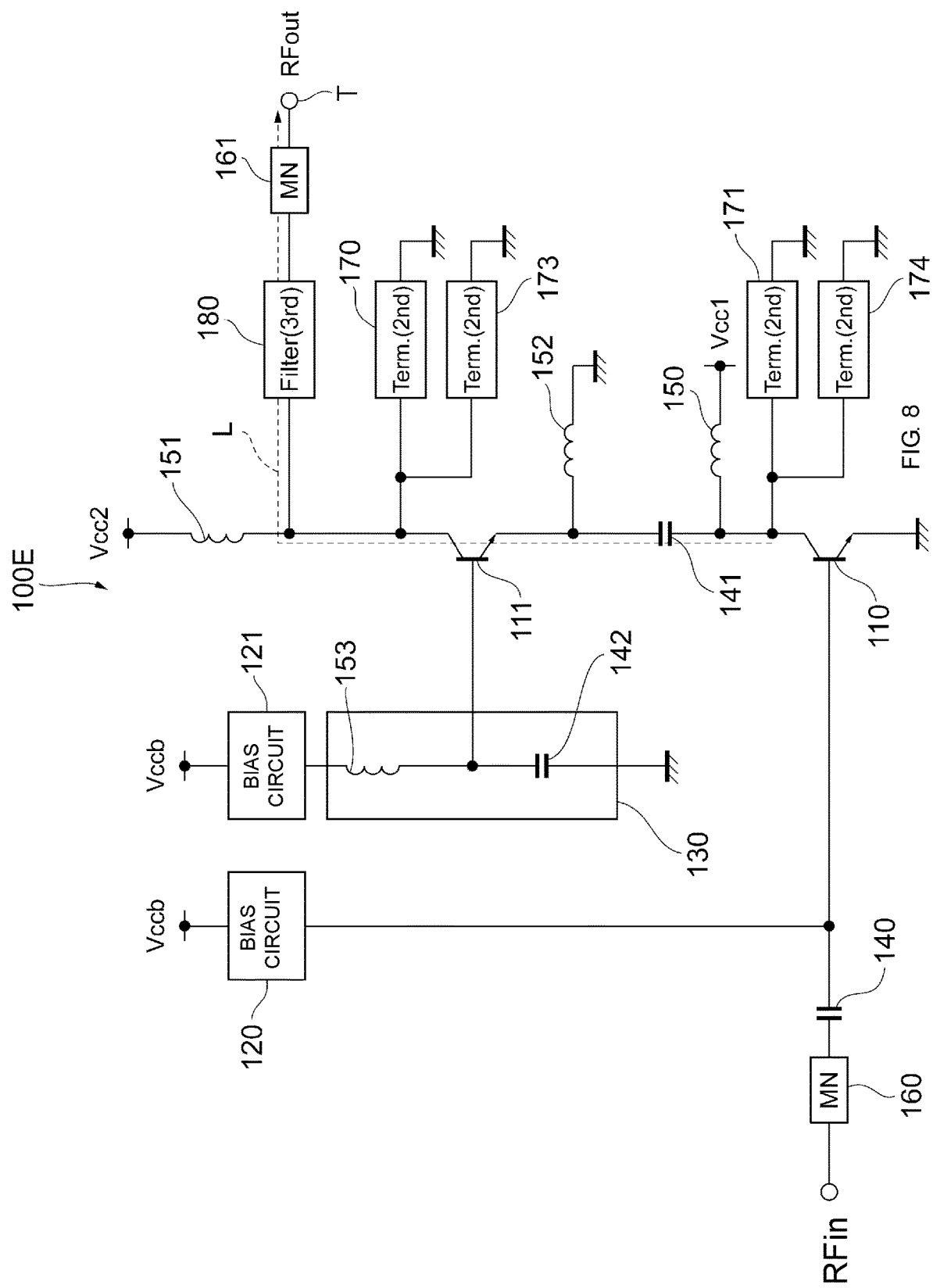
FIG. 8 illustrates an example configuration of a power amplifier circuit according to a fifth embodiment of the present disclosure.

FIG. 8 illustrates an example configuration of a power amplifier circuit 100E according to a fifth embodiment of the present disclosure. As illustrated in FIG. 8, unlike the power amplifier circuit 100B, the power amplifier circuit further includes termination circuits 173 and 174.

The termination circuit 173 is connected in parallel with the termination circuit 170. The termination circuit 174 is connected in parallel with the termination circuit 171. In this embodiment, the four termination circuits 170, 171, 173, and 174 have resonant frequencies set to around the second-order harmonic band and shifted from each other.

Figure 9:
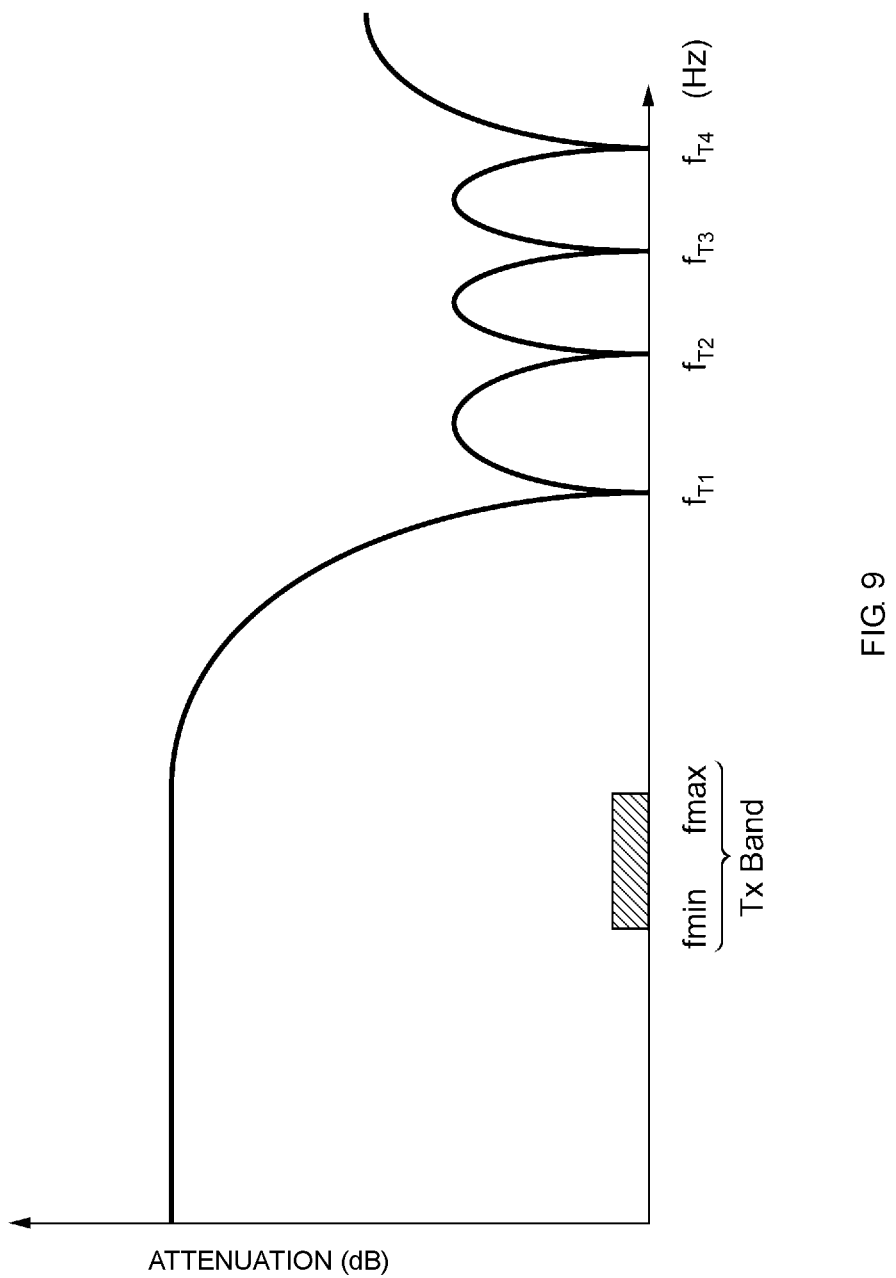
FIG. 9 is a graph illustrating the frequency characteristic of the attenuation of an output signal in the power amplifier circuit illustrated in FIG. 8.

FIG. 9 is a graph illustrating the frequency characteristic of the attenuation of an output signal in the power amplifier circuit 100E.

As illustrated in FIG. 9, in this embodiment, the termination circuits 170, 171, 173, and 174 respectively have resonant frequencies $f_{T1}$, $f_{T2}$, $f_{T3}$, and $f_{T4}$ set to around the second-order harmonic band such that the resonant frequency $f_{T2}$ is higher than the resonant frequency $f_{T1}$, the resonant frequency $f_{T3}$ is higher than the resonant frequency $f_{T2}$, and the resonant frequency $f_{T4}$ is higher than the resonant frequency $f_{T3}$. This setting allows the second-order harmonic to be attenuated over a wider range than that for the power amplifier circuit 100D including the two termination circuits 170 and 171. Thus, the power-added efficiency of the power amplifier circuit 100E can be improved over a wider range than that for the power amplifier circuit 100D.

Figure 10:
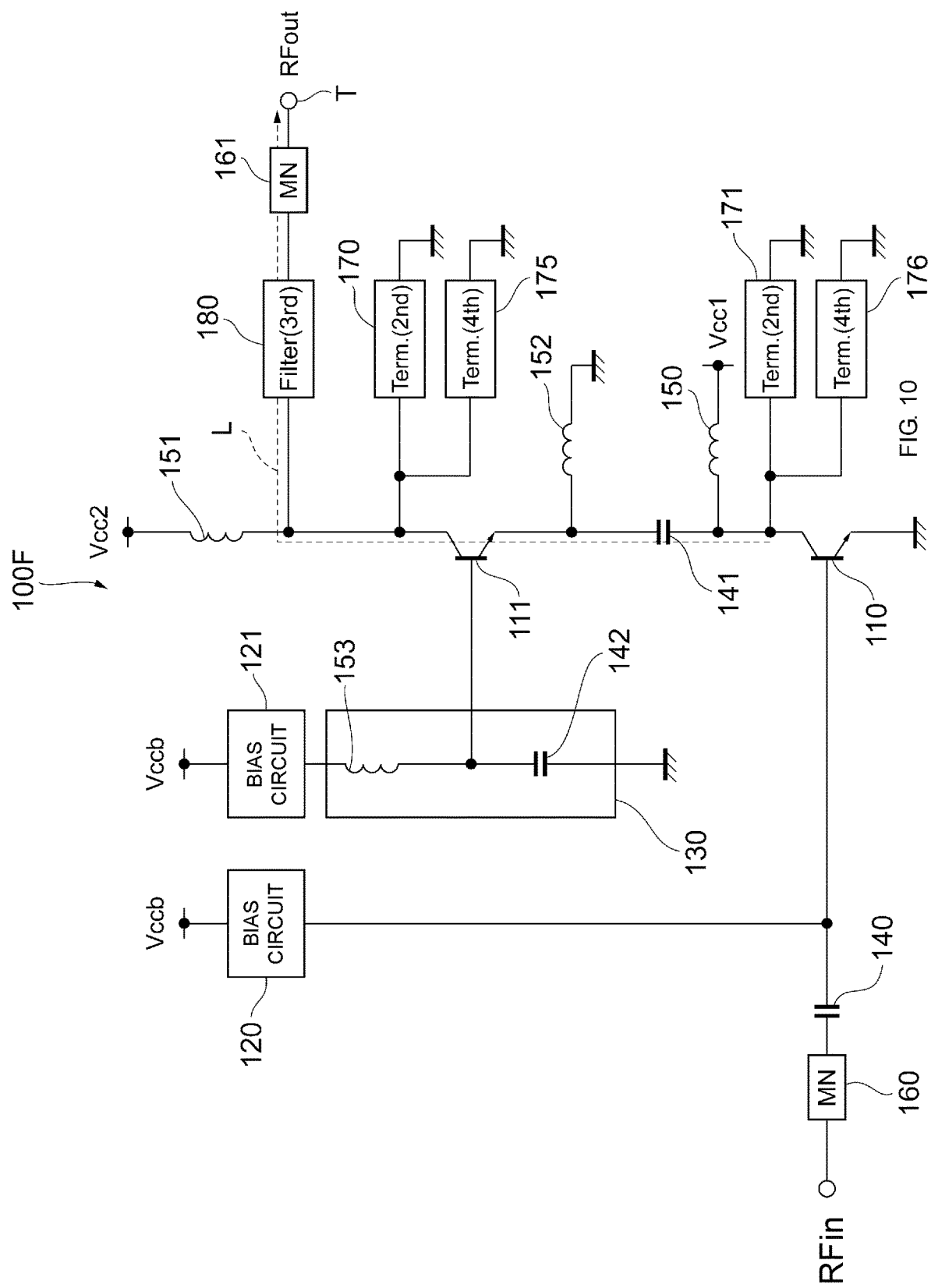
FIG. 10 illustrates an example configuration of a power amplifier circuit according to a sixth embodiment of the present disclosure.

FIG. 10 illustrates an example configuration of a power amplifier circuit 100F according to a sixth embodiment of the present disclosure. As illustrated in FIG. 10, unlike the power amplifier circuit 100E, the power amplifier circuit 100F includes termination circuits 175 and 176 that short-circuit the fourth-order harmonic, instead of the termination circuits 173 and 174 that short-circuit the second-order harmonic.

The termination circuit 175 (fourth termination circuit) is connected in parallel with the termination circuit 170. The termination circuit 176 (third termination circuit) is connected in parallel with the termination circuit 171. The termination circuits 175 and 176 have resonant frequencies set to around the fourth-order harmonic band. This setting can make the harmonic band to be attenuated wider than that for the power amplifier circuit 100B including two termination circuits. In addition, unlike the power amplifier circuit 100E in which the four termination circuits 170, 171, 173, and 174 short-circuit the second-order harmonic, in the power amplifier circuit 100F, both the second-order harmonic and the fourth-order harmonic are short-circuited, and thus, the voltage and current waveforms of the amplifier may become more ideal. Accordingly, the power-added efficiency is expected to be further improved.

As described above, the harmonics to be short-circuited by a plurality of termination circuits are not limited to the second-order harmonic, and may include any other even-order harmonic. The termination circuit 170 and the termination circuit 171 may have an equal resonant frequency or different resonant frequencies, and the termination circuit 175 and the termination circuit 176 may have an equal resonant frequency or different resonant frequencies.

Figure 11:
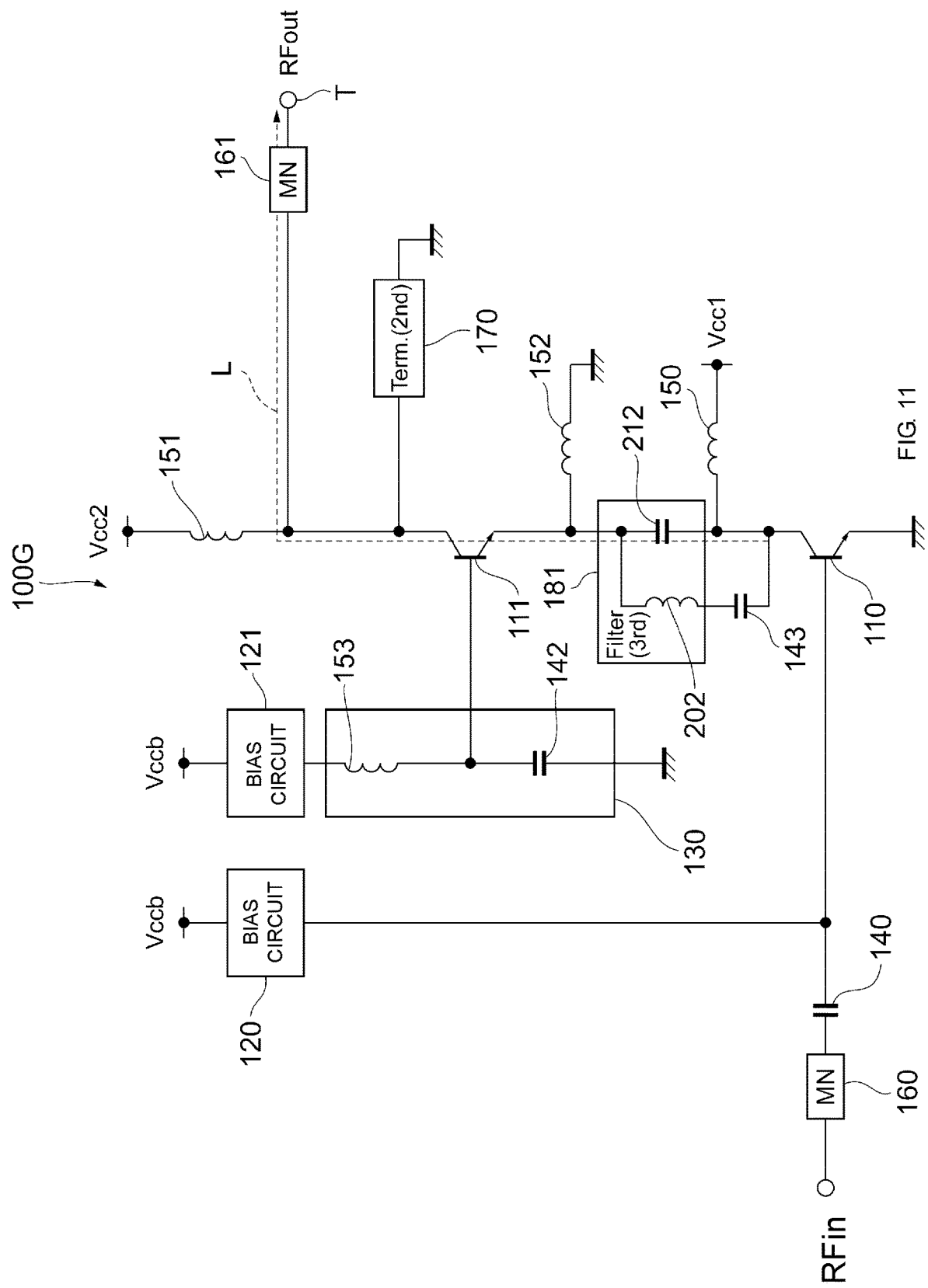
FIG. 11 illustrates an example configuration of a power amplifier circuit according to a seventh embodiment of the present disclosure.

FIG. 11 illustrates an example configuration of a power amplifier circuit 100G according to a seventh embodiment of the present disclosure. As illustrated in FIG. 11, unlike the power amplifier circuit 100A, the power amplifier circuit 100G includes a filter circuit 181 instead of the filter circuit 180, and a capacitor 143 instead of the capacitor 141.

The filter circuit 181 is disposed along the transmission path L between the collector of the lower transistor 110 and the emitter of the upper transistor 111. Specifically, the filter circuit 181 is constituted by an LC parallel resonant circuit including an inductor 202 (second inductor) and a capacitor 212, which are connected in parallel. The filter circuit 181 has a resonant frequency set so as to be included in the third-order harmonic band, for example. Specifically, the resonant frequency is determined by the inductance value of the inductor 202 and the capacitance value determined when the capacitor 212 and the capacitor 143 are connected in series.

The capacitor 143 is disposed between the inductor 202 and the collector of the lower transistor 110. Like the capacitor 141 according to the embodiments described above, the capacitor 143 (third capacitor) has a function of cutting off the upper transistor 111 and the lower transistor 110 for direct current. The capacitor 143 has a capacitance value set to be sufficiently larger than the capacitance value of the capacitor 212. Accordingly, the resonant frequency of the filter circuit 181 is determined by the capacitance value of the capacitor 212. That is, the effect of the capacitance value of the capacitor 143 on the resonant frequency of the filter circuit 181 can be reduced.

In this manner, a filter circuit that makes the third-order harmonic open-circuited is not necessarily positioned between the upper transistor 111 and the output terminal T, and may be positioned between the lower transistor 110 and the upper transistor 111. With this configuration, the power amplifier circuit 100G can achieve advantages similar to those of the power amplifier circuit 100A.

Figure 12:
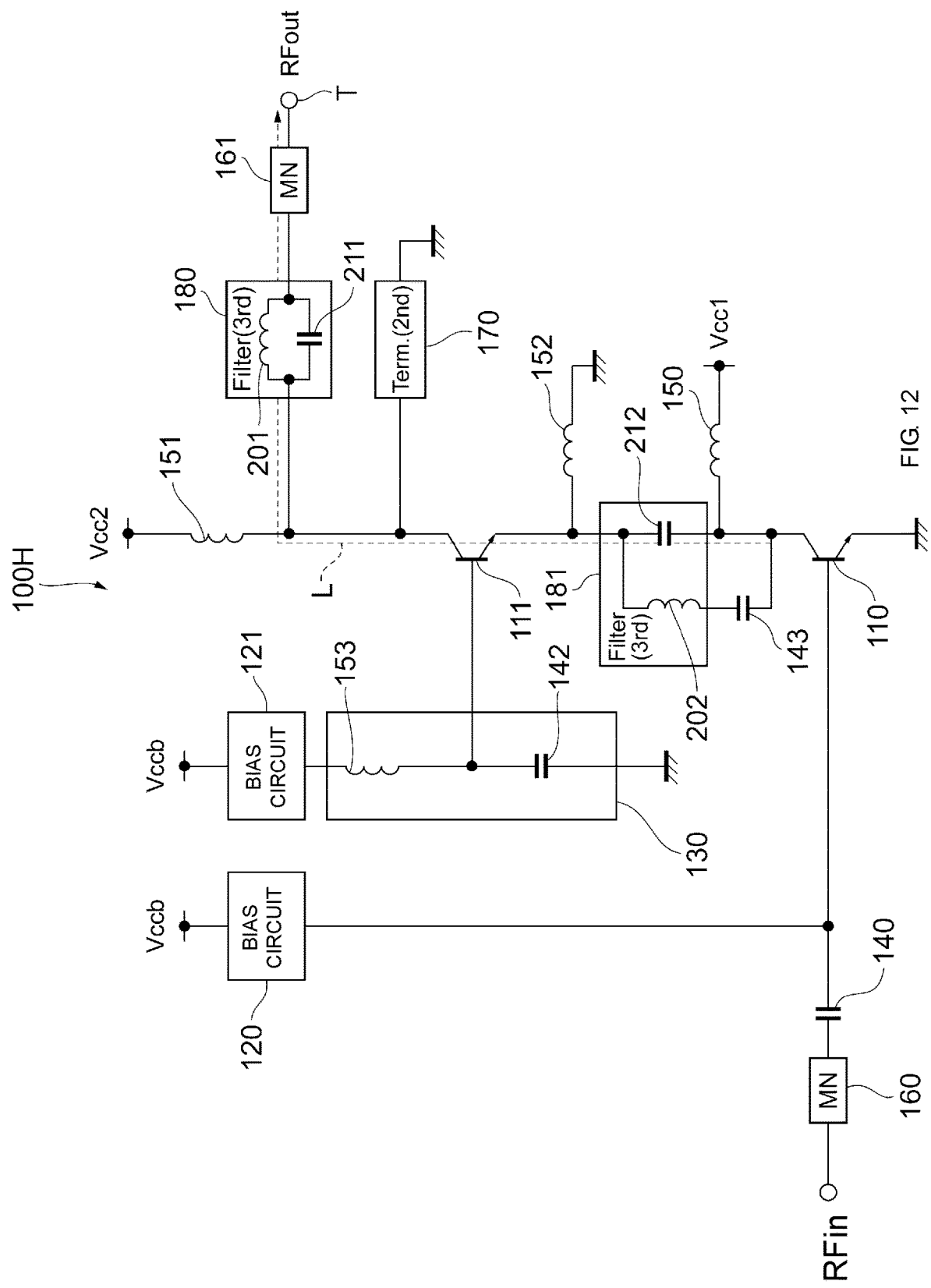
FIG. 12 illustrates an example configuration of a power amplifier circuit according to an eighth embodiment of the present disclosure.

FIG. 12 illustrates an example configuration of a power amplifier circuit 100H according to an eighth embodiment of the present disclosure. As illustrated in FIG. 12, the power amplifier circuit 100H includes both the filter circuit 180 illustrated in FIG. 1 and the filter circuit 181 illustrated in FIG. 11.

The power amplifier circuit 100H including the two filter circuits 180 (second filter circuit) and 181 (first filter circuit) can separately control the voltage and current waveforms of the collector of the upper transistor 111 and the voltage and current waveforms of the collector of the lower transistor 110. The resonant frequency of the filter circuit 180 and the resonant frequency of the filter circuit 181 may be equal or different.

Figure 13:
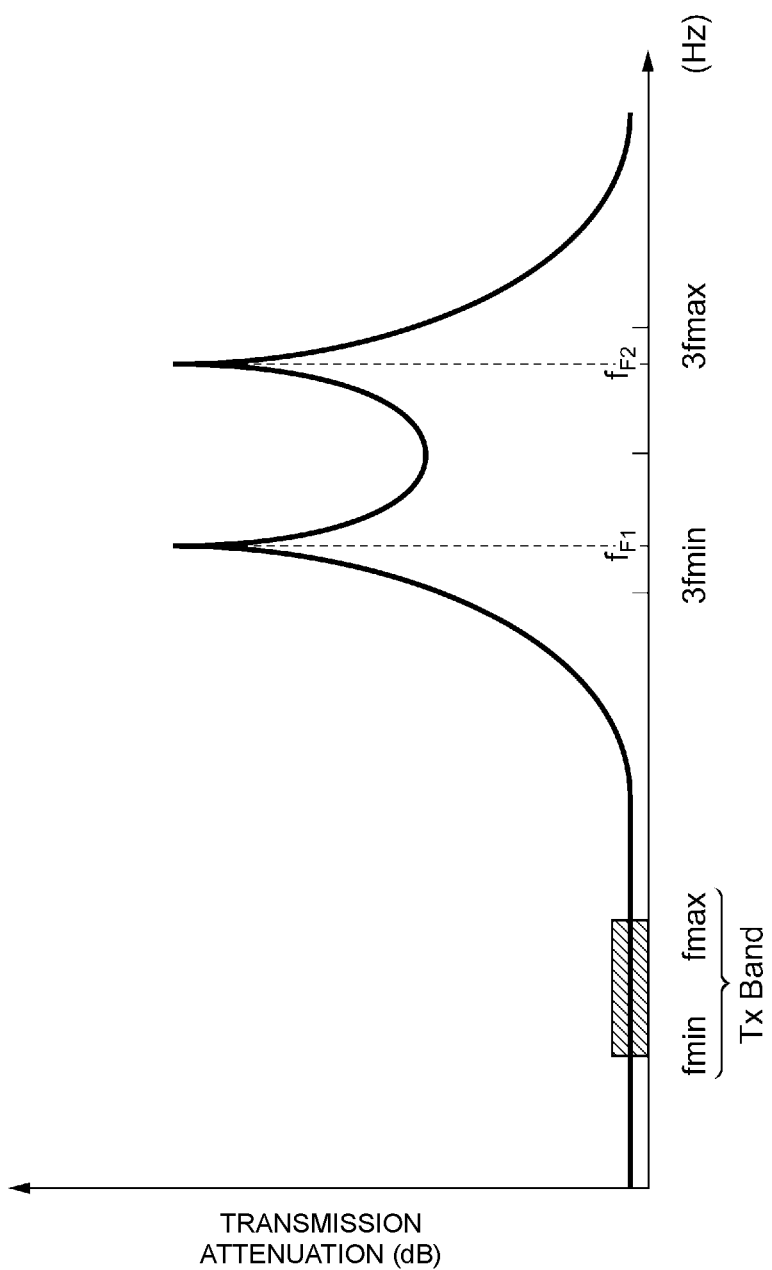
FIG. 13 is a graph illustrating the frequency characteristic of the transmission attenuation of an output signal in the power amplifier circuit illustrated in FIG. 12.

FIG. 13 is a graph illustrating the frequency characteristic of the transmission attenuation of an output signal in the power amplifier circuit 100H. In the graph illustrated in FIG. 13, the vertical axis represents the transmission attenuation (dB) of the filter circuits 180 and 181. The illustrated graph is obtained when the resonant frequency of the filter circuit 180 and the resonant frequency of the filter circuit 181 are set to be different.

As illustrated in FIG. 13, the filter circuits 180 and 181 respectively have resonant frequencies $f_{F1}$ and $f_{F2}$ set so as to be included in the third-order harmonic band. In this embodiment, this setting allows the transmission of the third-order harmonic to be suppressed over a wider range than that for a configuration including a single filter circuit.

The power amplifier circuits 100A to 100H with improved power-added efficiency that can increase the maximum output power have been described. The embodiments described above provide a configuration in which an even-order harmonic is short-circuited to ground potential and an odd-order harmonic is made open-circuited, thereby allowing the amplifier to operate in a class-F mode. Alternatively, a power amplifier circuit may be configured such that an odd-order harmonic is short-circuited to ground potential and an even-order harmonic is made open-circuited. For example, the power amplifier circuit 100A is taken as an example. The termination circuit 170 may short-circuit the third-order harmonic to ground potential, and the filter circuit 180 may make the second-order harmonic open-circuited. In this case, the current waveform of the amplifier is close to a rectangular waveform, and the voltage waveform of the amplifier is close to a half-wave rectified waveform. Thus, the amplifier operates in an inverse class-F mode. Also in the inverse class-F operation, power consumption can be reduced, and power-added efficiency can be improved.

In the class-F operation, the current waveform is a half-wave rectified waveform, which may cause the parasitic resistance component of a transistor to affect power amplification characteristics. However, the voltage waveform is a rectangular waveform, which can reduce the risk of exceeding a withstand voltage of a transistor. In the inverse class-F operation, in contrast, the voltage waveform is a half-wave rectified waveform, which may cause a risk of exceeding a withstand voltage of a transistor. However, the current waveform is a rectangular waveform, resulting in reduced effect on the power amplification characteristics caused by the parasitic resistance component.

Exemplary embodiments of the present disclosure have been described. The power amplifier circuits 100A to 100H include the transistor 110 having a first terminal, a second terminal, and a third terminal, wherein the power supply voltage Vcc1 is supplied to the first terminal, the second terminal is connected to ground, and an input signal is supplied to the third terminal; the capacitor 141; the transistor 111 having a first terminal, a second terminal, and a third terminal, wherein the power supply voltage Vcc2 is supplied to the first terminal, an amplified signal obtained by amplifying the input signal is outputted to the output terminal T from the first terminal, the second terminal is connected to the first terminal of the transistor 110 via the capacitor 141, and a driving voltage is supplied to the third terminal; the inductor 152 that connects the second terminal of the transistor 111 to ground; the voltage regulator circuit 130 that adjusts the driving voltage; and at least one termination circuit 170 that short-circuits one of an even-order harmonic or odd-order harmonic of the amplified signal to ground potential. The at least one termination circuit 170 is disposed so as to branch off from a node along the transmission path L extending from the first terminal of the transistor 110 to the output terminal T through the capacitor 141 and the transistor 111. With this configuration, the power amplifier circuits 100A to 100H can output an amplified signal having a voltage amplitude that is about twice as high as that in a configuration in which transistors are not vertically connected to each other, and can allow the amplifier to operate in a class-F mode. Accordingly, the power amplifier circuits 100A to 100H can be provided with improved power-added efficiency while increasing the maximum output power.

In the power amplifier circuit 100C, furthermore, the termination circuit 172 includes the capacitor 212 that branches off from a point on a coil conductor included in the inductor 152 and that is connected to ground. With this configuration, in the power amplifier circuit 100C, the termination circuit 172 can be constituted by fewer elements than in the power amplifier circuit 100B.

The power amplifier circuits 100A to 100H further includes at least one filter circuit 180 (181) that makes the other of the even-order harmonic or odd-order harmonic of the amplified signal open-circuited. The at least one filter circuit 180 (181) is connected in series along the transmission path L between the first terminal of the transistor 110 and the output terminal T. With this configuration, in the power amplifier circuits 100A to 100H, the waveforms of the collector voltage and collector current of the transistors 110 and 111 can be shaped, compared to a configuration not including the filter circuit 180 (181). Thus, the power-added efficiency is further improved.

Although the position of the filter circuit 181 is not limited, as in the power amplifier circuits 100G and 100H, for example, the filter circuit 181 may be positioned between the transistor 110 and the transistor 111 and may include the capacitor 212 and the inductor 202, which are connected in parallel.

Further, the power amplifier circuits 100B to 100F includes the termination circuit 171 (172) branching off from a node between the first terminal of the transistor 110 and the second terminal of the transistor 111 along the transmission path L, and the termination circuit 170 branching off from a node between the first terminal of the transistor 111 and the output terminal T along the transmission path L. Each of the termination circuit 171 (172) and the termination circuit 170 short-circuits the second-order harmonic to ground potential. With this configuration, even if the symmetry of the lower and upper transistors 110 and 111 fails, the voltage and current waveforms can be appropriately shaped.

The power amplifier circuit 100F further includes the termination circuit 176 connected in parallel with the termination circuit 171, and the termination circuit 175 connected in parallel with the termination circuit 170. Each of the termination circuit 176 and the termination circuit 175 short-circuits the fourth-order harmonic to ground potential. With this configuration, both the second-order harmonic and the fourth-order harmonic are short-circuited, and the voltage and current waveforms of the amplifier may become more ideal. The power-added efficiency is expected to be further improved.

Further, the power amplifier circuit 100H includes the filter circuit 181 connected in series along the transmission path L between the first terminal of the transistor 110 and the second terminal of the transistor 111, and the filter circuit 180 connected in series along the transmission path L between the first terminal of the transistor 111 and the output terminal T. Each of the filter circuit 181 and the filter circuit 180 makes the third-order harmonic open-circuited. This configuration allows the transmission of the third-order harmonic to be suppressed over a wider range than that for a configuration including a single filter circuit.

Furthermore, each of the termination circuits described above may short-circuit an odd-order harmonic to ground potential, instead of an even-order harmonic. Likewise, each of the filter circuits described above may make an even-order harmonic open-circuited, instead of an odd-order harmonic. With this configuration, the current waveform of the amplifier is close to a rectangular waveform, and the voltage waveform of the amplifier is close to a half-wave rectified waveform. Thus, the amplifier operates in an inverse class-F mode. Accordingly, even the configuration described above can improve the power-added efficiency of the power amplifier circuit.

The embodiments described above are intended to help easily understand the present disclosure, and are not to be used to construe the present disclosure in a limiting fashion. Various modifications or improvements can be made to the present disclosure without departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments and the arrangement, materials, conditions, shapes, sizes, and the like thereof are not limited to those described in the illustrated examples, but can be modified as appropriate. Furthermore, the elements included in the embodiments can be combined to the extent that it is technically possible to do so, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a lower transistor having a first terminal, a second terminal, and a third terminal, wherein a first power supply voltage is supplied to the first terminal, the second terminal is connected to ground, and an input signal is supplied to the third terminal;
   a first capacitor;
   an upper transistor having a first terminal, a second terminal, and a third terminal, wherein a second power supply voltage is supplied to the first terminal of the upper transistor, an amplified signal obtained by amplifying the input signal is output to an output terminal from the first terminal of the upper transistor, the second terminal of the upper transistor is connected to the first terminal of the lower transistor via the first capacitor, and a driving voltage is supplied to the third terminal of the upper transistor;
   a first inductor that connects the second terminal of the upper transistor to ground; and
   at least one termination circuit that short-circuits one of an even-order harmonic or an odd-order harmonic of the amplified signal to ground potential,
   the at least one termination circuit being disposed so as to branch off from a node along a transmission path extending from the first terminal of the lower transistor to the output terminal through the first capacitor and the upper transistor.

2. The power amplifier circuit according to claim 1, wherein the at least one termination circuit includes a second capacitor that branches off from a node on a coil conductor included in the first inductor, the second capacitor being connected to ground.

3. The power amplifier circuit according to claim 1, further comprising
   at least one filter circuit that makes the other of the even-order harmonic or odd-order harmonic of the amplified signal open-circuited,
   the at least one filter circuit being connected in series along the transmission path between the first terminal of the lower transistor and the output terminal.

4. The power amplifier circuit according to claim 2, further comprising
   at least one filter circuit that makes the other of the even-order harmonic or odd-order harmonic of the amplified signal open-circuited,
   the at least one filter circuit being connected in series along the transmission path between the first terminal of the lower transistor and the output terminal.

5. The power amplifier circuit according to claim 3, further comprising a second inductor and a third capacitor, the second inductor and the third capacitor being connected in series with each other and being connected in parallel with the first capacitor.

6. The power amplifier circuit according to claim 4, further comprising a second inductor and a third capacitor, the second inductor and the third capacitor being connected in series with each other and being connected in parallel with the first capacitor.

7. The power amplifier circuit according to claim 1, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a second-order harmonic to ground potential.

8. The power amplifier circuit according to claim 7, wherein the at least one termination circuit further includes
a third termination circuit connected in parallel with the first termination circuit, and
a fourth termination circuit connected in parallel with the second termination circuit, and
wherein each of the third termination circuit and the fourth termination circuit short-circuits a fourth-order harmonic to ground potential.

9. The power amplifier circuit according to claim 2, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a second-order harmonic to ground potential.

10. The power amplifier circuit according to claim 9, wherein the at least one termination circuit further includes
a third termination circuit connected in parallel with the first termination circuit, and
a fourth termination circuit connected in parallel with the second termination circuit, and
wherein each of the third termination circuit and the fourth termination circuit short-circuits a fourth-order harmonic to ground potential.

11. The power amplifier circuit according to claim 3, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a second-order harmonic to ground potential.

12. The power amplifier circuit according to claim 9, wherein the at least one termination circuit further includes
a third termination circuit connected in parallel with the first termination circuit, and
a fourth termination circuit connected in parallel with the second termination circuit, and
wherein each of the third termination circuit and the fourth termination circuit short-circuits a fourth-order harmonic to ground potential.

13. The power amplifier circuit according to claim 3, wherein the at least one filter circuit includes
a first filter circuit connected in series along the transmission path between the first terminal of the lower transistor and the second terminal of the upper transistor, and
a second filter circuit connected in series along the transmission path between the first terminal of the upper transistor and the output terminal, and
wherein each of the first filter circuit and the second filter circuit makes a third-order harmonic open-circuited.

14. The power amplifier circuit according to claim 1, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a third-order harmonic to ground potential.

15. The power amplifier circuit according to claim 2, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a third-order harmonic to ground potential.

16. The power amplifier circuit according to claim 3, wherein the at least one termination circuit includes
a first termination circuit branching off from a node between the first terminal of the lower transistor and the second terminal of the upper transistor along the transmission path, and
a second termination circuit branching off from a node between the first terminal of the upper transistor and the output terminal along the transmission path, and
wherein each of the first termination circuit and the second termination circuit short-circuits a third-order harmonic to ground potential.

17. The power amplifier circuit according to claim 3, wherein the at least one filter circuit includes
a first filter circuit connected in series along the transmission path between the first terminal of the lower transistor and the second terminal of the upper transistor, and
a second filter circuit connected in series along the transmission path between the first terminal of the upper transistor and the output terminal, and
wherein each of the first filter circuit and the second filter circuit makes a second-order harmonic open-circuited.

18. The power amplifier circuit according to claim 1, wherein:

the first terminal of the lower transistor is a collector or a drain, the second terminal of the lower transistor is an emitter or a source, and the third terminal of the lower transistor is a base or a gate.

19. The power amplifier circuit according to claim 1, wherein:

the first terminal of the upper transistor is a collector or a drain, the second terminal of the upper transistor is an emitter or a source, and the third terminal of the upper transistor is a base or a gate.

\* \* \* \* \*